United States Patent [19]
VanDover

[11] Patent Number: 6,093,944
[45] Date of Patent: Jul. 25, 2000

[54] DIELECTRIC MATERIALS OF AMORPHOUS COMPOSITIONS OF TI-O$_2$ DOPED WITH RARE EARTH ELEMENTS AND DEVICES EMPLOYING SAME

[75] Inventor: Robert Bruce VanDover, Maplewood, N.J.

[73] Assignee: Lucent Technologies Inc., Murray Hill, N.J.

[21] Appl. No.: 09/090,295

[22] Filed: Jun. 4, 1998

[51] Int. Cl.[7] .................................................. H01L 27/108
[52] U.S. Cl. ........................................................ 257/310
[58] Field of Search .................................. 257/310, 295, 257/306, 532

[56] References Cited

U.S. PATENT DOCUMENTS

| | | | |
|---|---|---|---|
| 5,340,607 | 8/1994 | Friz et al. | 427/162 |
| 5,585,300 | 12/1996 | Summerfelt | 437/60 |
| 5,989,626 | 11/1999 | Coombs et al. | 427/162 |
| 6,025,291 | 2/2000 | Murakawa | 501/136 |

OTHER PUBLICATIONS

Gartner, M., et al., Spectroellipsometric characterization of lanthanide–doped TiO2 films . . ., Thin Solid Films, 234 (1993) 561–5.

*Primary Examiner*—Sara Crane
*Attorney, Agent, or Firm*—Matthews, Collins, Shepherd & Gould, P.A.

[57] ABSTRACT

A dielectric film useful for a capacitor in a DRAM device comprises an amorphous composition of $Ti_{1-y}M_yO_x$, where y is approximately in the range 0.01 to 0.50, x is approximately 1.0 to 2.0, and M is a lanthanide rare earth element and advantageously, selected from the group of neodymium (Nd), terbium (Tb) and dysprosium (Dy). The concentration of dopants in the a-TiO$_2$ film is preferably from 5 to 50 at. % and more preferably from 10 to 30 at. %. The inventive dielectric materials have a high dielectric constant of greater than 30 and figure of merit of greater than 9.0 $\mu C/cm^2$.

14 Claims, 3 Drawing Sheets

DIELECTRIC MATERIALS OF AMORPHOUS COMPOSITIONS OF TI-O₂ DOPED WITH RARE EARTH ELEMENTS AND DEVICES EMPLOYING SAME

FIELD OF THE INVENTION

The invention relates to dielectric materials comprising amorphous films of titanium oxide ($TiO_2$), doped with lanthanide rare earth elements and more particularly, $_{1-y}M_yO_x$, where y is approximately in the range 0.01 to 0.50, x=1.0 to 2.0, and M is a lanthanide rare earth element and advantageously, an element selected from the group of neodymium (Nd), terbium (Tb) and dysprosium (Dy). The invention has particular application for use in silicon-chip integrated circuit devices including a capacitor of a dynamic random access memory (DRAM) device.

BACKGROUND OF THE INVENTION

Materials having high dielectric constants have been researched for use as dielectric layers for thin film capacitors. As microelectronic circuits have become increasingly integrated, the demand for smaller components has become stronger. The quest for miniaturization is particularly ardent with regard to DRAM cell devices. The migration of integrated circuits to smaller feature sizes is promoting interest in the development of thin film dielectrics having dielectric constants ($\epsilon$) greater than those of previously used materials. Typically, films of a-$SiO_x$ have been used as a dielectric material in DRAM capacitors or capacitors of integrated-circuit devices. As the cell size has shrunk, however, designers have resorted to use of extremely thin a-$SiO_x$ films, but these films are problematic as they exhibit a decreased reliability due to finite breakdown fields. Thus, efforts have been directed toward developing new dielectric materials which can be substituted for a-$SiO_x$ films, thus avoiding the inherent limitations of those films.

Attention has been focused on materials with high values for the dielectric constant ($\epsilon$) and figure of merit, the figure of merit (FOM) being the multiple of the dielectric constant ($\epsilon$) and breakdown field ($E_{br}$) of a material. In other words, the dielectric constant ($\epsilon$) times the breakdown field ($E_{br}$) [MV/cm] equals its figure of merit ($\epsilon E_{br}$) [$\mu C/cm^2$]. The figure of merit is a useful unit of measure of the efficacy of a dielectric material because it corresponds to the maximum charge that may be stored on a capacitor and does not depend upon film thickness. In general, one has a wide design flexibility in varying the thickness of the dielectric films used in integrated circuit applications. For example, in high-quality deposited $SiO_2$ films, the dielectric constant is about 3.7, the breakdown field ($E_{br}$) is about 8 MV/cm, translating to a FOM of about 2.6 $\mu C/cm^2$.

Titanium-oxide ($TiO_2$) has a high dielectric constant, making films of $TiO_2$ potentially useful in various roles in integrated circuits, such as metal oxide semiconductor or memory capacitors, gate oxides, and other circuit elements. See, e.g., Y. H. Lee, K. K. Chan, and M. J. Brady, "Plasma Enhanced Chemical Vapor Deposition of $TiO_2$ In Microwave-Radio Frequency Hybrid Plasma Reactor," J. VAC. SCI. TECH. A 13 (3) 1995, at p. 596; J. Yan, D. C. Gilmer, S. A. Campbell, W. L. Gladfelter, and P. G. Schmidt, "Structural and Electrical Characterization of $TiO_2$ Grown From Titanium Tetrakis-Isopropoxide (TTIEP) And TTIP/$H_2O$ Ambients," J. VAC. SCI. TECH. B 14 (3) 1996, at p. 1706.

In the past, $TiO_2$ films have been prepared by a variety of processes, including metalorganic, low pressure, and plasma-assisted chemical vapor deposition (e.g., MOCVD, LPCVD, and PCVD), plasma oxidation, and reactive sputtering. Dielectric constants between 25 and 75 generally have been reported for pure x-$TiO_2$ films. However, x-$TiO_2$ films have demonstrated high leakage currents (low breakdown fields), which directly and adversely influences the operation of DRAM circuits and impacts on the reliability of the capacitors. Few studies have reported that the leakage current densities are a function of electric fields, but generally it is believed that high leakage currents arise from defects in the films, especially oxygen vacancies. Efforts thus have been directed toward reducing defects (and particularly oxygen vacancies) in the $TiO_2$ films to thereby decrease the leakage currents. Two approaches have dominated these efforts: (1) optimizing the deposition conditions, and (2) annealing the films. See S. C. Sun and T. F. Chen, "Effects of Electrode Materials and Annealing Ambients on the Electrical Properties of $TiO_2$ Thin Films by Metalorganic Chemical Vapor Deposition," JPN. J. APPL. PHYS. 36 (1997), part I, No. 3B, at p. 1346. Nonetheless, $TiO_2$ films having sufficiently low leakage currents for reliable use in DRAM devices presently have not been obtained.

Another approach recently taken to decrease leakage currents or otherwise improve the dielectric properties of x-$TiO_2$ films has been to incorporate foreign cations into the crystalline films. For example, known composites have included crystalline barium strontium titanate {x-(Ba,Sr)$TiO_3$}, described in U.S. Pat. No. 5,552,355, for "Compensation of the Temperature Coefficient of the Dielectric Constant of Barium Strontium Titanate," assigned to the present assignee and incorporated herein. Incorporating barium and strontium-containing dielectric materials into integrated circuit devices has proved problematic, however, as these materials are not sufficiently compatible with the silicon components of the devices. Another known composite comprises perovskite-titanite films such as $PbTiO_3$, which also may be doped with zirconium (Zr) to yield the ceramic (Pb,Zr)$TiO_3$, known as PZT. See also E. S. Ramakrishnan, Kenneth D. Cornett, Gary H. Shapiro, and Wei-Yean Howng, "Dielectric Properties of Radio Frequency Magnetron Sputtering Deposited Zirconium Titanate-Based Thin Films," J. ELECTROCHEM SOC., 145 at 358–62 (January 1998) (discussing zirconium-titanate based films). PZT also has been doped with lanthanum in an effort to reduce leakage current, the composite being PZLT. See S. B. Desu, "Minimization of Fatigue In Ferroelectric Films," PHYSICA STATUS SOLIDI A (Oct. 16, 1995), Vol. 151, no. 2, at p. 467–80.

Study of titanium-oxide ceramics for use as dielectric materials as discussed above has focused on the crystalline and polycrystalline phases of the materials, as opposed to amorphous films. In fact, a relative decrease in the dielectric constant for amorphous titanium-oxide films is reported in O. Nakagawara, Y. Toyoda, M. Kobayashi, Y. Yoshino, Y. Katayama, H. Tabata, and T. Kawai, "Electrical Properties of (Zr,Sn)$TiO_4$ Dielectric Thin Film Prepared by Pulsed Laser Deposition," J. APPL. PHYS. 80, 388 (1996) ("Nakagawara"), which attribute this decrease to the ionic polarizahility of the materials. Nevertheless, the applicant has studied amorphous films of titanium-oxide as dielectrics in the continuing search for new materials and methods for incorporation into a DRAM cell or integrated circuit device. Amorphous titanium-oxide compositions exhibiting usefull properties as dielectrics are described in co-pending U.S. patent application Ser. No. 08/936,132, entitled "Dielectric Materials of Amorphous Compositions and Devices Employing Same," filed Sep. 24, 1997, by Schneemeyer and Van Dover (the inventor herein) ("the '132 application"), assigned to Lucent Technologies, the assignee herein, which is hereby incorporated by reference. The compositions of the '132 application involve amorphous titanium-oxide films doped with both tin (Sn), and either hafnium (Hf) or zirconium (Zr). Therefore, two separate dopants are used. To simplify the process of preparing the dielectric materials, it would be advantageous to discover a composition involving fewer dopants.

Use of the praseodymium (Pr) in titanium oxide films is discussed in V. D. Kushkov, A. M. Zaslavskii, and A. V. Mel'nikov, "Phase Relations and Structural Characteristics of Pr—Ti—O Films," INORGANIC MATERIALS (December 1991), Vol. 27, No. 12, at pp. 2293–5 (translation of Izvestiya Akademii Nauk SSSR, Neorganicheskie Materialy (December 1991), Vol. 27, No. 12, at pp. is 2671–2). Kushkov et al. discuss whether these films are crystalline or amorphous as a function of the temperature use to prepare the films, and they do not discuss electrical properties. In M. Gartner, C. Parlog P. Osiceanu, "Spectroellipsometric Characterization Of Lanthanide-Doped Films Obtained Via The Sol-Gel Technique," THIN SOLID FILMS (Oct. 25, 1993), Vol. 234, No. 1–2, at pp. 561–66 titanium-oxide films doped with lanthanum (La), europium (Eu), samarium (Sm) or gadolimiim (Gd) are discussed in terms of altering the structure or optical properties the films, but they do not address whether these dopants may decrease the leakage current or improve the materials' dielectric properties.

As may be appreciated, those concerned with the development of integrated circuit devices continually search for new materials and methods for improving device performance as the circuit size becomes progressively smaller. This search includes the discovery of new dielectric materials compatible for use in DRAM cells or silicon-chip integrated circuit devices having high dielectric constants and large breakdown fields (low leakage currents).

SUMMARY OF THE INVENTION

Applicant has discovered that adding lanthanide rare earth elements to amorphous $TiO_2$ films dramatically improves the dielectric properties of the films. Specifically, substitution of 5–50 at. %, and more preferably 10–30 at. % of the rare earth dopant (per at. % Ti) is found to dramatically decrease the leakage current, increase the breakdown voltage, and yet retain the relatively high dielectric constant of the films. In a preferred embodiment, the composition comprises $a$-$Ti_{1-y}M_yO_x$, where y is approximately in the range 0.01 to 0.50 and x is approximately 1.0 to 2.0, and M is a rare earth element selected from the group neodymium (Nd), terbium (Tb), and dysprosium (Dy). The high-specific-capacitance of the $a$-$Ti_{1-y}M_yO_x$ films thus produced are suitable for incorporation into Si integrated circuit technology.

BRIEF DESCRIPTION OF THE DRAWINGS

For a better understanding of the invention, an exemplary embodiment is described below, considered together with the accompanying drawings, in which.

It is to be understood that these figures are for the purposes of illustrating the concepts of the invention and except for the graphs are not to scale.

DETAILED DESCRIPTION OF THE INVENTION

The discussion below is divided into three parts. In Part A, an application of this invention is described with reference to use of the dielectric material in a DRAM capacitor. In Part B, the inventive dielectric material and preferred embodiments are described. Lastly, in Part C, methods for depositing the dielectric film of the invention on a substrate are described.

A. Application Example

Figure 1:
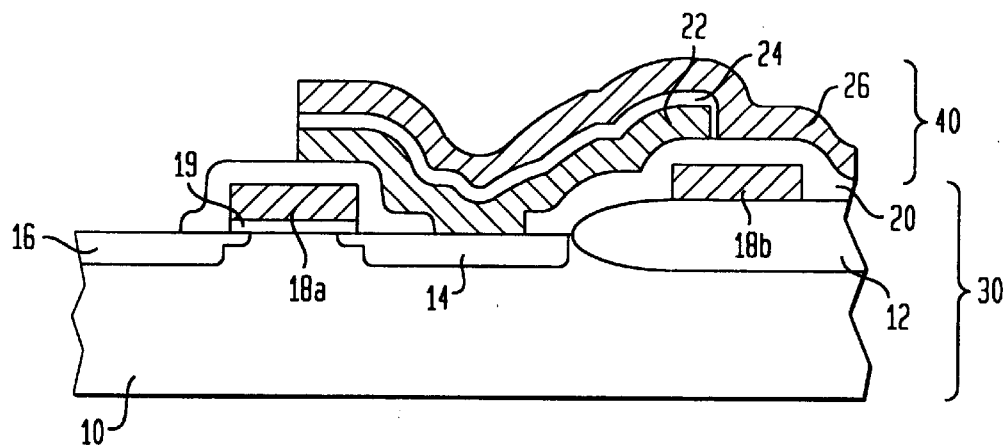
FIG. 1 is a schematic cross-section illustrating one embodiment of a DRAM cell design comprising a dielectric layer according to the invention.

By way of illustration, FIG. 1 shows a cross-section of a typical stacked capacitor DRAM design incorporating the dielectric layer of this invention; however, it is to be understood that the invention is not limited to use with DRAM cells and may be used in other applications as well, such as hybrid integrated circuits, capacitors of other devices, or MOSFET gate dielectrics.

A common cell design used in DRAM applications involves a transfer gate (e.g., an MOS field-effect transistor or MOSFET), and a storage node consisting of a capacitor. Referring to FIG. 1, a basic structure for the MOSFET 30 is shown. The substrate 10, comprised typically of silicon, is doped with ions to form impurities regions of n-type or p-type conductivity (the former involving use of arsenic or phosphorous dopants and the latter involving boron dopants), to form source 14 and drain 16 diffusions for the MOFSET. MOFSET gate structures 18a, 18b element (M). The bottom electrode 22 and top electrode 26, together the thin dielectric film 24 typically fabricated with polysilicon are deposited over the substrate and may be isolated therefrom by a layer of gate oxide 19. The substrate 10 will have disposed on its surface a field oxide pattern (or FOX) 12. Traditionally, both the gate oxide 19 and field oxide 12 are fabricated with silicon dioxide. The capacitor 40 is disposed on the silicon substrate 10 in conductive relation with one or more of the impurity regions, comprising a bottom electrode 22 and top electrode 26, separated by a thin film of a dielectric material 24. The electrodes 22, 26 may be comprised of thin films of Ti, TiN, Al, Al doped with 0.5% Cu, or other materials known in the art for forming electrodes for DRAM applications. The film of dielectric material 24 fills the space between the bottom electrode 22 and top electrode 26, and is comprised of the inventive material, i.e., an amorphous film of titanium oxide ($TiO_2$), doped with a lanthanide rare earth sandwiched between them, form a capacitor. An insulating layer 20, typically comprised of boron phosphorus silicate glass, may separate the capacitor from the gate structures 18a, 18b.

In an alternative embodiment of the invention, the inventive dielectric is used for the gate dielectric of a MOSFET device, e.g., a device having a metal-insulator-semiconductor gate structure. Such devices are known in the field and described, for example, in the following reference and patents, all of which are incorporated herein by reference: S. M. Sze, SEMICONDUCTOR DEVICES, PHYSICS AND TECHNOLOGY (John Wiley & Sons, 1985); U.S. Pat. No. 5,541,429, "Dielectrically Isolated Semiconductor Devices Having Improved Characteristics," issued Sep. 17, 1996 to M. A. Shibib and assigned to Lucent Technologies, Inc., the assignee herein; U.S. Pat. No. 5,670,396, "Method of Making a Rugged DMOS Device," issued Mar. 7, 1995 to M. A. Shibib and assigned to the assignee herein; and U.S. Pat. No. 5,381,031, "Method for Forming a BiCDMOS," issued Dec. 20, 1994 to Yilmaz et al. and assigned to Silconix Inc. The term MOSFET device as used herein is intended to include NMOS, PMOS and CMOS technology, including devices identified in the field as DMOS (wherein "D" stands for "diffusion" or "double diffusion"), transistors such as IGBT (Insulated Gate Bipolar Transistor), BiCMOS (CMOS having bipolar devices), DGDMOS (Dual Gate DMOS), and thyristors.

B. Preferred Compositions

Applicant has discovered that adding lanthanide rare earth elements to amorphous $TiO_2$ thin films dramatically improves the dielectric properties of the films. The term lanthanide rare earth element as used herein is intended to encompass the lanthanides in the f-block of the periodic table in the row from and including lanthanum (La) to lutetium (Lu), namely, the elements cons-sting of lanthanum (La), cerium (Ce), praseodymium (Pr), neodymium (Nd), samarium (Sm), europium (Eu), gadolinium (Gb), terbium (Tb), dysprosium (Dy), holmium (Ho), erbium (Er), thulium (Tm), ytterbium (Yb), and lutetium (Lu). Promethium (Pm) is excluded since it is radioactive. A subclass of useful dopants includes Ce, Nd, Tb, Dy, Ho, Er, Tm, Yb, and Lu. A further preferred subclass of dopants are selected from the group of Nd, Tb, and Dy. For these systems, a high value for the FOM is obtained, namely, in the range 13–17 $\mu C/cm^2$. The dielectric constant is generally lower than for pure a-$TiO_2$ films, but the breakdown field is much improved and about a factor of two or more higher than for films of unsubstituted a-$TiO_2$ (the leakage current is about two or more orders of magnitude lower). Notably, it was found in comparison that substitution with a single dopant selected from one of Y, Hf, Ta, or Sn causes an increase in the leakage current.

Set forth below in Table 1, for example, are values reflecting measured properties of capacitors formed using inventive dielectric films comprising a-$TiO_2$ doped with Nd, Tb, and Dy, as well as values for films comprised of pure a-$TiO_2$, presented for comparison. The FOM, breakdown fields, and dielectric constants are each tabulated. $FOM_{99}$ is the figure of merit at the 99th percentile, meaning that for a given experiment, one percent of the capacitors would have a FOM higher than this value. $J(E_{op})$ is the current density at the operating field determined by the dielectric constant. The operating field depends on the specific application but for Table I below, it is given by the operating voltage (i.e., 1.25 V in one specific application) divided by the required oxide thickness, where the oxide thickness is chosen to give a required specific capacitance (i.e., 49 $fF/\mu m^2$ in the same application).

TABLE I

| Substituent | at. % dopant (range) for max FOM | $FOM_{99}$ ($\mu C/cm^2$) | $\epsilon$ at $FOM_{99}$ | $E_{br}$ at $FOM_{99}$ (MV/cm) | $J(E_{op})$ at $FOM_{99}$ ($\mu A/cm^2$) |
|---|---|---|---|---|---|
| none | — | 13.3 | 115 | 0.9 | 5 |
| Nd | 10–20 | 13.4 | 48 | 2.5 | 0.08 |
| Tb | 10–20 | 14.0 | 49 | 2.1 | 0.04 |
| Dy | 10–15 | 14.0 | 47 | 2.5 | 0.03 |

Each of the films of the capacitors of Table 1 were prepared by co-sputtering in a 20-percent oxygen ambient (with the balance argon) at room temperature with a base electrode of TiN and a counter-electrode of Hg.

Figure 2:
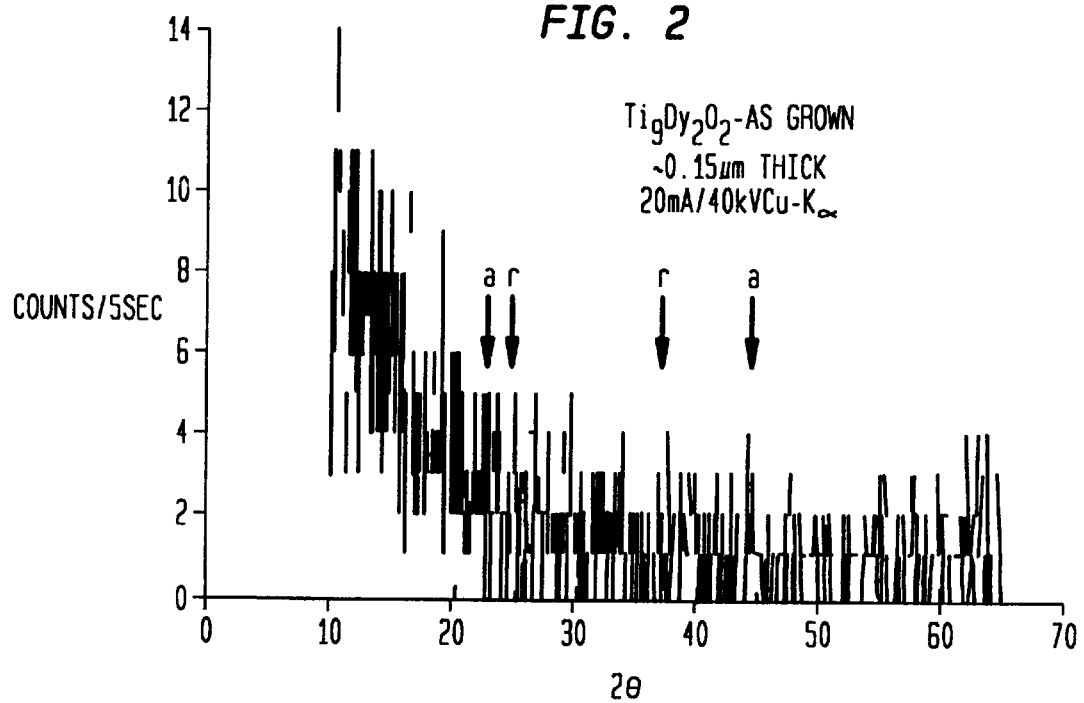
FIG. 2 is a graph showing an X-ray diffraction pattern for one embodiment of the invention comprising an a-Ti—Dy—O film grown on a single-crystal Si substrate.

X-ray characterization of the inventive dielectric film comprising $Ti_8$—$Dy_{0.2}$—$O_{2.0}$ grown on a single-crystal Si substrate was performed with $CuK_\alpha$ radiation (20 mA*40 kV), in a four circle gonimeter. A typical θ-2θ scan was taken on a relatively thick film (e.g., about 0.15 $\mu m$ thick), deposited on Si to minimize extraneous scattering. The results are reported in FIG. 2. The complete absence of any X-ray peaks demonstrates the amorphous nature of the film, which was grown at room temperature under the same conditions as the films used for electrical characterization. The increase at low angles is due to background scattering; there is no sign of crystallinity in the film. The location of the strongest peaks expected for $TiO_2$ in the rutile (r) and anatase (a) structures are indicated in FIG. 2 by arrows.

Figure 3:
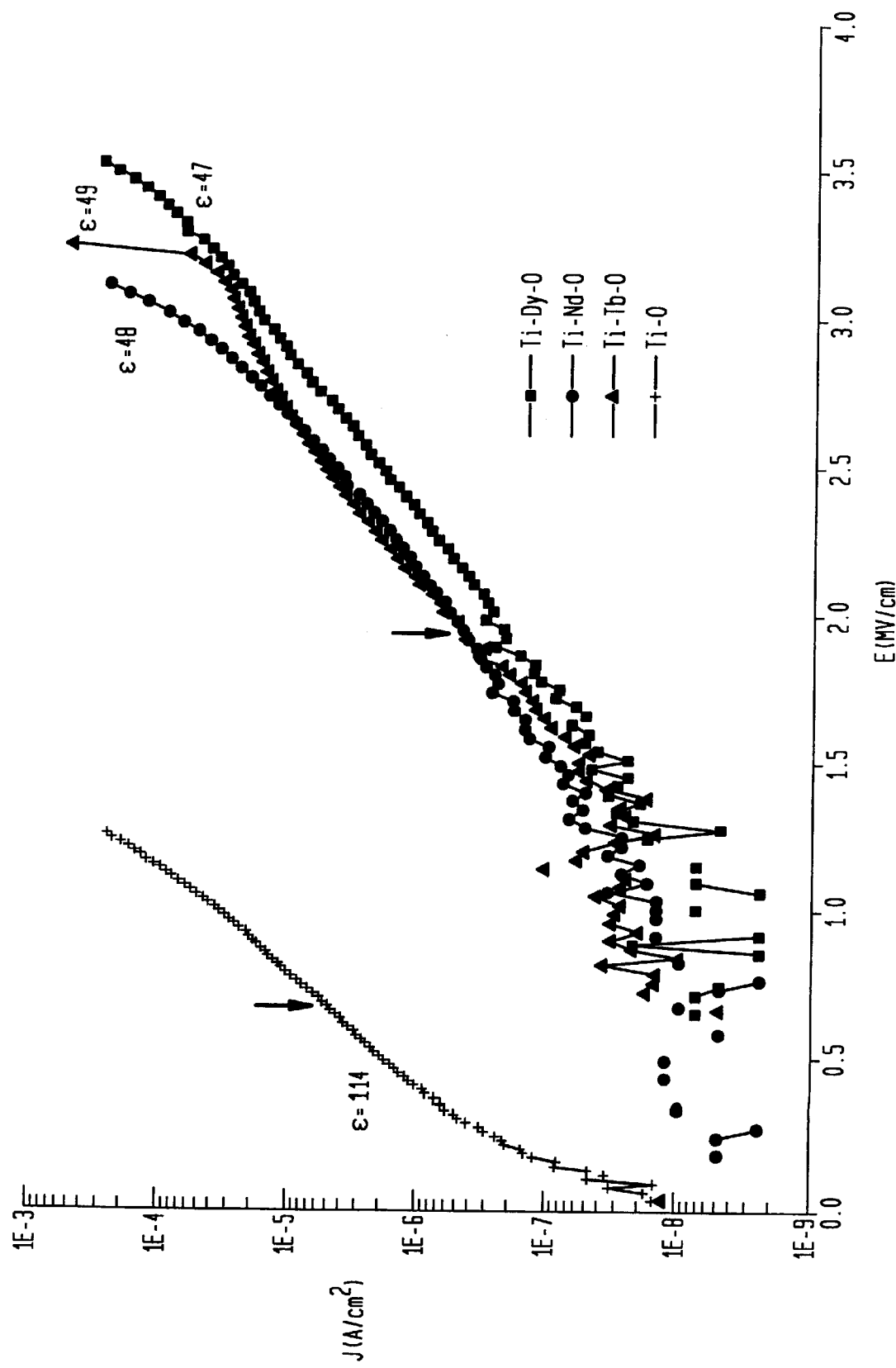
FIG. 3 is a graph plotting curves for the breakdown field as a function of current density for representative capacitors having dielectric films comprising an embodiment of the dielectric material $a$-$Ti_{1-y}M_yO_y$, where y is approximately 0.1 and M is Nd, Tb, or Dy, along with a curve (–+–) for an undoped film presented for comparison.

Additionally, current-voltage characteristics of certain inventive capacitors are plotted in FIG. 3, providing further insight into the properties of the substituted films. More specifically, FIG. 3 plots the variation in breakdown field as a function of current density for the films Ti—Dy—O, Ti—Nd—O, and Ti—Tb—O, as compared with films of pure a-$TiO_2$. The arrows in FIG. 3 reflect the electric field for operation in a capacitor for a DRAM storage cell with 49 $fF/\mu m^2$ at 1.25V. As can be seen, the substituted films demonstrate a significantly lower leakage over a much larger range of operating fields than the films of pure a-$TiO_2$.

Notably, the electrical properties of the films as discussed herein were evaluated using a scanning Hg-probe instrument in most cases. The diameter of the Hg probe was 0.8 mm, leading to a capacitor area of $4.05 \times 10^{-3}$ $cm^2$. Reliable contacts to the bottom TiN electrode were made using In solder in the region of the substrate masked by the mounting clip. The capacitance and breakdown voltage were measured at a number of points on the substrate, typically 975 points on 1 mm centers in a 15×65 mm rectangle. The Hg-probe instrument when properly prepared has been found to provide highly reliable and reproducible results. Some Ti-M-0 films were also evaluated by preparing capacitors with photolithographically-defined Al-0.5 atomic % Cu counter-electrodes ranging from 100×100 $\mu m$ to 500×500 $\mu m$ in area. These were characterized electrically with an HP4192A impedance analyzer and an HP4140B I-V tester.

C. Sample Preparation

Various techniques known in the field are suitable for deposition of the inventive films. They include sputtering with a composite oxide target, chemical vapor deposition (CVD), plasma-enhanced CVD, laser ablation, and on-axis reactive sputtering using a single, composite metal target with RF, pulsed-dc or dc power. Incorporating a second cation is particularly straightforward in reactive sputtering synthesis using composite targets. By reactive co-sputtering using two guns in an off-axis geometry, a-$Ti_{1-y}M_yO_x$ films may be prepared having continuously varying dopant concentrations. Thus, in a single run, films can be deposited with M-Ti atomic ratios in the range 0.01<y<0.6, and systematic run-to-run variations are eliminated.

Figure 4:
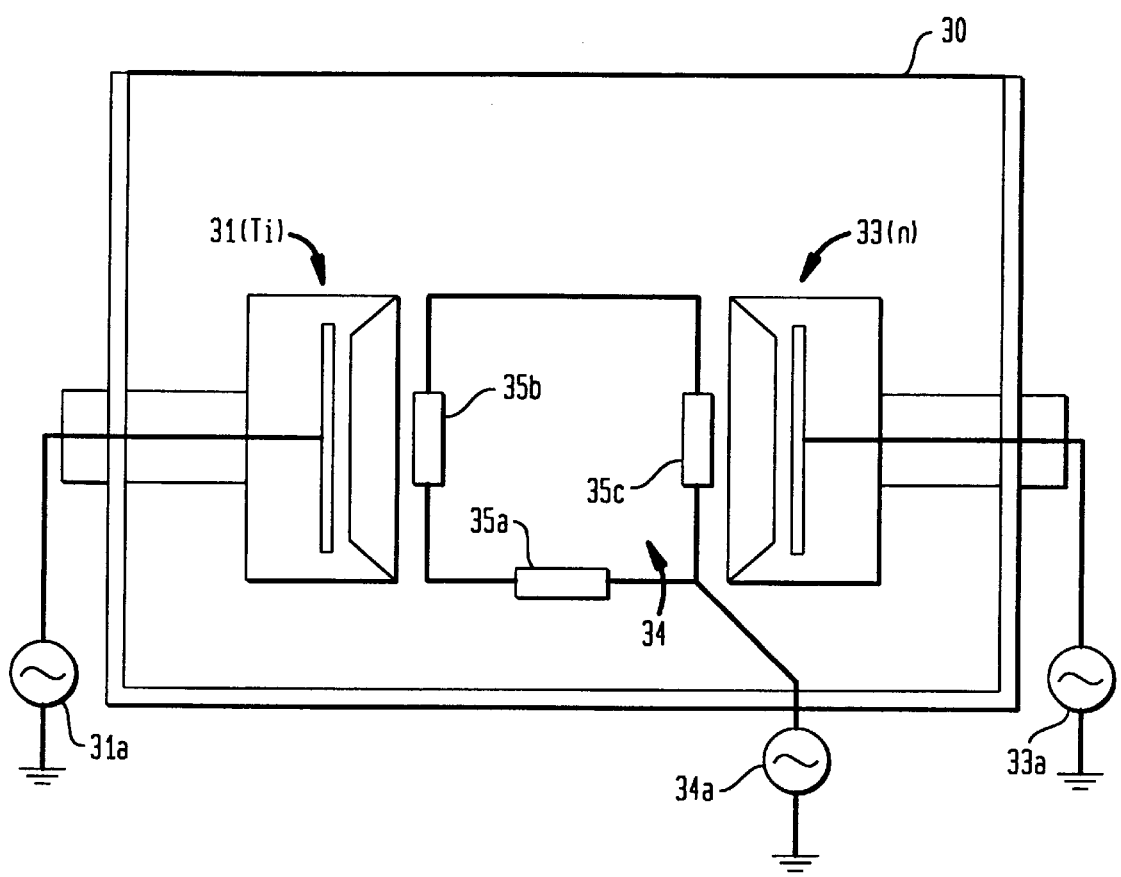
FIG. 4 is a top view schematic representation of a radio-frequency sputtering system that may be used in forming the dielectric film according to the invention.

Films may be prepared by either off-axis or on-axis reactive sputtering. An exemplary apparatus useful for depositing films via radio frequency reactive sputtering is shown in FIG. 4. Referring to FIG. 4, the apparatus comprises a vacuum chamber 30, having planar magnetron sputter guns 31 and 33. The guns 31 and 33 advantageously have two-inch diameter targets and are arranged in a facing-targets configuration (i.e., toward both the substrate to be coated 34 and each other at a 180-degree angle relative to each other), for depositing Ti and the rare earth element, M, respectively. The targets may be disposed approximately two centimeters from opposite ends of the substrate, which typically has a rectangular shape. The sputter guns and substrate each are connected to an RF power source (31a, 33a, and 34a), and allowed to self-bias. The Ti gun 31 typically may be run at about 100 W, while the power delivered to the M gun 33 may vary to provide an appropriate composition of Ti to M at the substrate midpoint, which typically is about 20 W for the M gun 33. Depositions may be performed with a total pressure of 30 mTorr for off-axis sputtering.

A substrate 34 used for deposition of the thin dielectric films typically comprises silicon wafers coated with about 5500 Angstroms thermal oxide, 450 Angstroms Ti, and 600 Angstroms TiN. Prior to the deposition process, the substrate 34 may be mounted to a thick aluminum substrate holder (hidden from view in FIG. 4), using tantalum spring clips 35a, 35b, and 35c. The substrate 34 may be connected to a power source 34a, for providing RF power (preferably about 10 W), during the deposition process to promote the surface mobility on the film. The substrate holder (not shown), may be heated using a tantalum-wire radiant heater and monitored with a chromel/alumel thermocouple inserted into the substrate holder. Preferably, the temperature should remain constant during the deposition process. The temperature of the substrate holder may be maintained at less than 50° C. during the deposition process, which may take place over a period of about twenty minutes. The thickness of the film may vary, with typical thicknesses being from about 35 nm adjacent the Ti gun to about 17 nm adjacent the M gun.

An exemplary deposition process is as follows.

Preparation Example 1.

A Ti—Dy—O film was prepared with off-axis co-sputtering deposition using the following steps. Initially, the substrate 34 was provided and coated with a layer of TiN of about 60 nm in thickness. The substrate was mounted onto an aluminum substrate holder using Tantalum-clips 35, and positioned so that the substrate was about 4 centimeters from the 2-inch Ti metal magnetron sputter gun target 31, and 8 centimeters from the Dy metal-magnetron sputter gun target 33. The sputter guns 31, 33 were positioned along the same horizontal plane and arranged with their targets facing inward at a 180 degree angle relative to each other, as shown in FIG. 4. The substrate 34 was positioned so that its top surface was parallel to the horizontal plane connecting the centers of the two magnetron targets but displaced about 3.5 centimeters below the plane of the targets.

Once the substrate 34 was appropriately positioned within the vacuum chamber 30, the deposition process began. The background pressure within the vacuum chamber was pumped to an approximate pressure of lower than $5 \times 10^{-6}$ Torr. Oxygen ($O_2$) gas was introduced, along with Argon gas, at 10 and 40 sccm, respectively (standard cubic centimeters per minute). The high-vacuum pump was throttled to obtain a total gas pressure of 30.0 mTorr. The RF power sources 31a, 33, and 34a were then activated to apply 10 W of RF power to the substrate 34, 125 W of power to the Ti gun, and 20 W of power to the Dy gun. RF matching circuits were tuned for each RF power supply 31a, 33a, and 34a, to obtain the minimum reflected power. The sputtered deposition were run for about twenty minutes, and then the RF power and gas supplies turned off The system was then vented and the sample retrieved.

Naturally, the process may be altered by varying the rare earth metal, substituting another lanthanide for Dy. In all the systems, improvements in the leakage current can be expected when the films are deposited under optimized conditions. For example, improved properties may be obtained by altering the substrate temperature, the oxygen/argon gas ratio, the total gas pressure, the level of bias, and so forth. Also, post-processing of the film, including thermal annealing in various atmospheres may improve the properties of the films. However, applicant found that the addition of nitrogen gas ($N_2$) into the sputtering atmosphere was not helpful and in fact, decreased the film quality significantly.

It should be understood that the embodiments described herein are merely exemplary and that a person skilled in the art may make variations and modifications without departing from the spirit and scope of the invention. The hybrid integrated circuit of this invention should not be limited to the examples or method of preparation described above. For example, to form the thin dielectric film of the capacitor, instead of the reactive sputtering method described above, other methods may be used, such as ion beam sputtering, chemical vapor deposition, electron cyclotron resonance sputtering, or laser ablation. Additionally, it is contemplated that the films can be doped with small concentrations of additional, appropriate elements to compensate for oxygen traps. All such variations and modifications are intended to be included within the scope of the appended claims.

I claim:

1. An article including a dielectric film comprising an amorphous composition of Ti—$O_2$ doped with a lanthanide rare earth element in which the lanthanide rare earth element is selected from the group of cerium (Ce), neodymium (Nd), terbium (Tb), dysprosium (Dy), holmium (Ho), erbium (Er), thulium (Tm), ytterbium (Yb), and lutetium (Lu).

2. An article including a dielectric film comprising an amorphous composition of Ti—$O_2$ doped with a lanthanide rare earth element in which the lanthanide rare earth element is selected from the group of neodymium (Nd), terbium (Tb), and dysprosium (Dy).

3. The article of claim 1, wherein the concentration of dopants is from 5 to 50 atomic percent dopants to titanium.

4. The article of claim 3, wherein the concentration of dopants is from 10 to 30 atomic percent dopants to titanium.

5. An article including a dielectric film comprising an amorphous composition of $Ti_{1-y}M_yO_x$, where y is approximately in the range 0.01 to 0.50, x is approximately 1.0 to 2.0, and M is a rare earth element selected from the group of neodymium (Nd), terbium (Tb), and dysprosium (Dy).

6. The article of claim 5, in which the dielectric constant of the composition measured at 10 kHz is greater than 45 and the figure of merit is greater than about 13.0 $\mu C/cm^2$.

7. An article comprising a capacitor having a pair of electrodes with a dielectric film disposed between the electrodes, wherein the dielectric film comprises an amorphous composition of Ti—$O_2$ doped with a lanthanide rare earth element.

8. The article of claim 5, comprising a capacitor having a pair of electrodes with the dielectric film disposed between the electrodes.

9. An article comprising a MOSFET device with a dielectric film comprising a gate dielectric for the MOSFET, wherein the dielectric film comprises an amorphous composition of Ti—$O_2$ doped with a lanthanide rare earth element.

10. The article of claim 5, comprising a MOSFET device with the dielectric film comprising a gate dielectric for the MOSFET.

11. An article comprising a memory device having a field effect transistor and a capacitor, wherein the dielectric film comprises an amorphous composition of Ti—$O_2$ doped with a lanthanide rare earth element.

12. The article of claim 11, comprising a DRAM device.

13. The article of claim 11, in which the field effect transistor has a gate dielectric and the capacitor comprises a pair of electrodes and disposed between the electrodes a layer of dielectric material, in which at least one of the gate dielectric or the layer of dielectric material comprises the amorphous composition.

14. The article of claim 5 comprising a memory device having a field effect transistor with a gate dielectric and a capacitor, the capacitor comprising a pair of electrodes and disposed between the electrodes a layer of dielectric material, in which at least one of the gate dielectric or the layer of dielectric material comprises the amorphous composition.

* * * * *